Nov. 24, 1970 W. KERN 3,543,106

MICROMINIATURE ELECTRICAL COMPONENT HAVING INDEXABLE RELIEF PATTERN

Filed March 13, 1968 3 Sheets-Sheet 1

INVENTOR
Werner Kern

BY [signature]
Attorney

Nov. 24, 1970 W. KERN 3,543,106

MICROMINIATURE ELECTRICAL COMPONENT HAVING INDEXABLE RELIEF PATTERN

Filed March 13, 1968 3 Sheets-Sheet 2

INVENTOR
Werner Kern
By [signature]
Attorney

INVENTOR
Werner Kern
BY [signature]
Attorney

United States Patent Office 3,543,106

Patented Nov. 24, 1970

3,543,106

MICROMINIATURE ELECTRICAL COMPONENT HAVING INDEXABLE RELIEF PATTERN

Werner Kern, Belle Mead, N.J., assignor to RCA Corporation, a corporation of Delaware Filed Mar. 13, 1968, Ser. No. 712,855

Int. Cl. H01l *11/00, 15/00*

U.S. Cl. 317—235 15 Claims

ABSTRACT OF THE DISCLOSURE

A microminiature electrical component in the form of a die having a relief pattern on one of its major surfaces. The relief pattern may be provided by etching an insulating layer disposed on the die surface. The die may comprise a semiconductor material, the semiconductor material itself being shaped to provide the desired relief pattern.

The relief pattern is oriented in a predetermined manner with respect to terminal pads on the die surface. The component may be assembled to an associated circuit in the form of a substrate provided with a relief pattern adapted to mate and interlock with the relief pattern on the die, so that registration of the die terminal pads with corresponding contact areas on the substrate surface is assured.

BACKGROUND OF THE INVENTION

This invention relates to the field of microminiature electrical components and more particularly to integral indexing means for such components, and the assembly of such components to associated circuitry.

In the manufacture of thin film, hybrid, and monolithic semiconductor devices, the active device is usually manufactured in the form of a die having major dimensions on the order of a few tens of mils. The die is provided with metallic terminal pads which must be electrically connected to associated circuitry by means of small wires. The terminal pads may typically have dimensions on the order of 2 to 5 mils, while the wire employed to make electrical connections to the terminal pads may be on the order of one mil in diameter.

Thus, the present state of the art requires electrical connections to the die terminal pads of such microminiature devices to be made manually under microscopic observation, with concomitant high manufacturing cost and limited reliability.

To alleviate this problem, much effort has recently been devoted to the development of techniques for bonding the terminal pads of a microminiature electrical component directly to conductive contact areas associated with circuitry or terminal leads to which the device is to be electrically connected. Such so-called "Flip-Chip" (in the case of a unitary active element) or "hybrid" (in the case of a composite circuit including a unitary active element and at least one passive element) components usually take the form of a die having one or more active semiconductor elements formed therein with terminal pads, provided on a major surface of the die, which are electrically coupled to various operating regions of the active and passive elements.

The terminal pads are solderable or otherwise bondable directly to corresponding contact areas disposed at the ends of terminal leads in a pattern corresponding to the pattern in which the terminal pads are disposed on the die, so that when the die is properly aligned with the contact areas, each terminal pad will register with a corresponding contact area.

The die is then moved to bring the die terminal pads adjacent the corresponding contact areas, and electrically conductive bonds are formed between each terminal pad and the corresponding contact area.

A major difficulty in utilizing such Flip-Chip or hybrid devices lies in the difficulty of positioning the extremely small dice so that the die terminal pads are properly registered with the adjacent contact areas.

Accordingly, an object of the present invention is to provide a microminiature electrical component which has terminal pads readily indexable with corresponding contact areas associated with terminal leads or circuitry to which the component terminal pads are to be electrically connected.

SUMMARY

The invention provides an electrical component in the form of a die. The die has at least one operating region; a number of terminal pads on at least one major surface of the die are electrically coupled to one or more corresponding regions of the die.

A major surface of the die has a relief pattern, at least a portion of which is in predetermined geometric alignment with the die terminal pads. According to a preferred embodiment of the invention, the relief pattern may be provided by a mesa or mesas raised above the remainder of the die surface.

IN THE DRAWING

DETAILED DESCRIPTION

Figure 1:
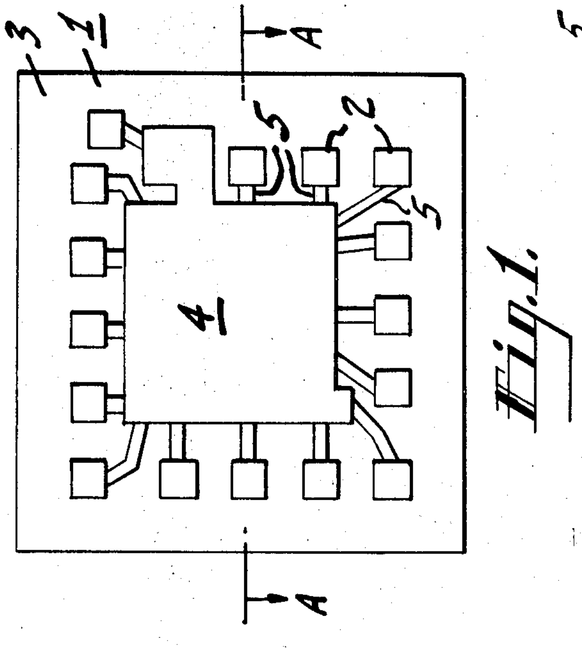
FIG. 1 shows an electrical component according to a preferred embodiment of the invention.

A plan view of a die 1, according to a preferred embodiment of the invention, is shown in FIG. 1 wherein the die 1 has a number of metallic terminal pads 2 disposed on a major surface 3 thereof. The active and/or passive electrical elements of the die are situated within the central area 4, the surface of which is raised above the remainder of the major surface 3.

Each of the terminal pads 2 is electrically coupled to a corresponding operating region of the die 1 by means of a deposited interconnection lead 5.

The die 1 may comprise (i) a semiconductor material having diffused regions formed therein to provide active semiconductor elements, in which case the central area 4 may comprise a raised portion of the semiconductor material, i.e. a single mesa or a plurality of mesas whose outer periphery forms the boundary of the central area 4, or (ii) a layer of insulating material having a thickness on the order of 1 to 10 mils.

Alternatively, the die 1 may comprise a laminate consisting of a relatively large glass chip into which the active element disposed in the central region 4 as well as the terminal pads 2 and interconnection leads 5 are embedded.

The purpose of the odd-shaped geometry of the raised central region 4 of the die 1 is to provide a relief pattern on the major surface 3 which is capable of interlocking with a corresponding relief pattern adjacent the contact areas of a substrate or terminal lead array to which the terminal pads 2 are to be bonded.

Figure 2:
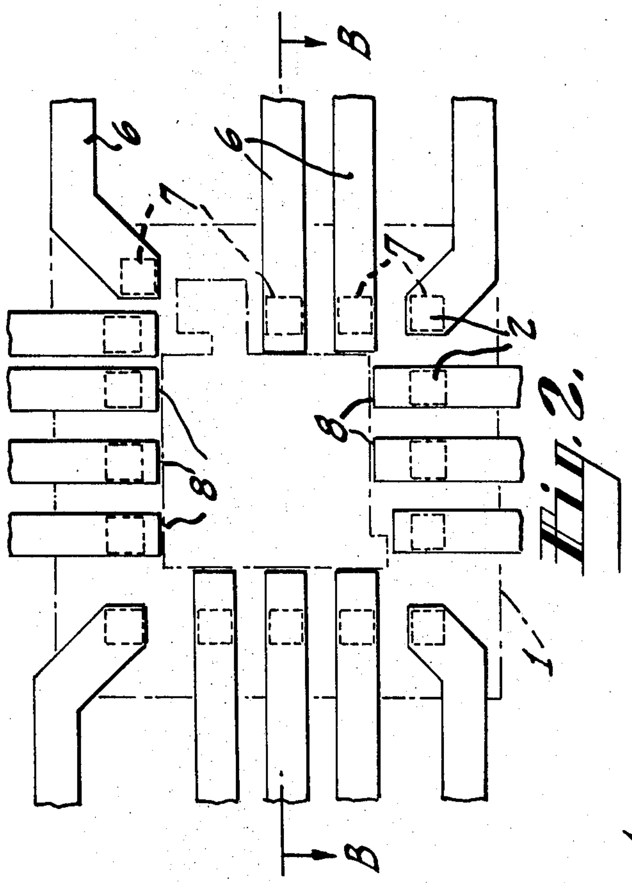
FIG. 2 shows a terminal lead structure adapted for receiving the component shown in FIG. 1.

Such a terminal lead array, which may or may not be disposed on a supporting substrate, is shown in FIG. 2, and comprises a number of terminal leads 6, selected portions 7 of which are adapted to serve as contact areas for bonding to corresponding terminal pads 2 of the die 1. A number of the terminal leads 6 have inwardly extending end portions 8, such that the various end portions 8 define a pattern similar to the shape of the raised central region 4 of the die 1.

The die 1 may be assembled as shown in FIG. 2, by moving the die relative to the terminal lead assembly so that the die occupies the portion shown by the dotted lines in FIG. 2. The raised region 4 of the die 1 will then interlock with the end portions 8 of the terminal leads 6, to insure that each terminal pad 2 of the die is in registration with a corresponding contract area 7 of one of the terminal leads 6.

Thereafter, the terminal pads 2 may be bonded to the corresponding contact areas 7 by ultrasonic or thermocompression bonding, soldering or any other suitable method. Soldering, e.g., may be accomplished in a batch process by providing a solder coating on the terminal pads 2, the contact areas 7, or both, and passing the die-terminal lead assembly through a furnace maintained at a suitable soldering temperature. The outline of the raised central region 4 of the die 1 is preferably shaped so that the region 4 can interlock with the end portions 8 of the terminal leads 6 in only one position.

Figure 3:
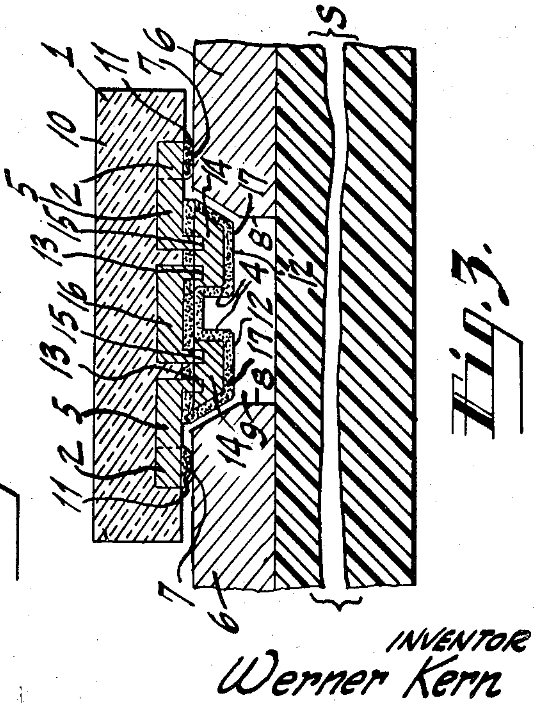

The die 1, when comprising a glass chip into which the other portions of the device are embedded, may have a cross-section similar to that shown in FIG. 3, which represents a sectional view taken normal to the cutting plane A—A in FIG. 1. The terminal lead assembly of FIG. 2 is shown in sectional view in FIG. 3, in a direction normal to the cutting plane B—B.

The terminal lead assembly, as seen in FIG. 3, includes a number of terminal leads 6 supported by an insulating substrate S. The terminal leads 6 have a thickness greater than the height of the raised central portion of the die 1, so that it is not necessary to provide a hole in the substrate S to permit proper interlocking of the raised region 4 of the die 1 with the end portions 8 of the terminal leads 6.

The substrate S may comprise any suitable insulating material, preferably one which has a coefficient of thermal expansion close to that of the metal which comprises the terminal leads 6. Such a material may comprise (i) an organic polymer such as a plastic resin, (ii) an inorganic-organic combination, such as a fiber glass filled epoxy resin, (iii) an oxide glass such as a Pyrex plate, or (iv) a ceramic such as alumina.

The terminal leads 6 may comprise any suitable metal which is bondable to the corresponding terminal pads 2 of the die 1. The terminal leads 6 may be part of a printed circuit pattern or may alternatively merely extend outwardly from the vicinity of the die 1 to provide a suitable package therefor. We prefer to employ a copper layer which has been etched to provide the terminal leads 6 in the desired pattern. Preferably, the copper terminal leads 6 are coated with a thin lead-tin solder layer.

Typically, the terminal leads 6 may have a thickness on the order of 5 mils and a width on the same order. The recess 9 defined by the ends 8 of the terminal leads 6 may be formed by etching or, preferably, by arc discharge machining to provide high precision without damaging the remaining portions of the terminal leads 6.

The die may comprise a glass chip 10 in which the terminal pads 2 are embedded. Each of the terminal pads 2 is provided with a raised solder globule 11, which may be formed, e.g., in the manner described in U.S. Pat. No. 3,292,240.

The interconnecting leads 5 are likewise embedded in the glass chip 10. The interconnecting leads 5 and terminal pads 2 preferably comprise a relatively high melting point metal such as tungsten, with an electrolessly plated nickel layer overlying the tungsten terminal pads 2. Also, embedded in or bonded to the glass chip 10 is the raised central region 4, which comprises a plurality of mesas 12, each of which is comprised of a semiconductor material such as monocrystalline silicon.

The particular mesas 12 shown in the cross-sectional view of FIG. 3 each contain a semiconductor diode, comprising a P type region 13 and an N type region 14 with a P-N junction therebetween. Electrical contact to the N type region 14 is made by means of a diffused $N^+$ region 15. The diodes shown in FIG. 3 are connected in series by means of the glass-embedded lead 16. The exposed surface of each of the semiconductor regions is protected by a thin silicon dioxide layer 17 having a thickness on the order of .2 to 2 microns.

The processes employed in manufacturing the die 1 are described in detail in U.S. patent application Ser. No. 580,934, filed Sept. 21, 1966, and assigned to the assignee of the instant application. It is necessary to manufacture the die 1, as previously pointed out, so that the various mesas 12 have an outer periphery conforming to the desired relief pattern. The disclosure of U.S. patent application Ser. No. 580,934 is incorporated herein by reference and made a part of this specification.

Rather than forming the die 1 as a laminate of insulating and semiconductor materials, the die 1 may comprise a monolithic semiconductor body.

Figure 4:
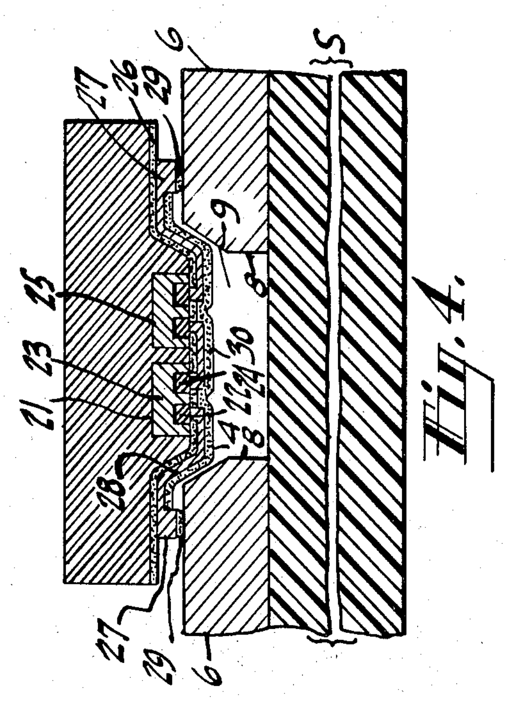
FIGS. 3 and 4 show alternative cross-sectional views of the component shown in FIG. 1 after assembly to the structure of FIG. 2.

Such a monolithic die 20 is shown in FIG. 4 assembled to a matching terminal lead array.

The die 20 comprises a monolithic semiconductor material such as silicon, one major surface of which has been shaped to provide a mesa whose periphery conforms to the desired relief pattern, i.e. to the raised central region 4 shown in FIG. 1. The die 20 is shown as including a diode 21 comprising a P type region 22 and adjacent N type region 23 with a P-N junction therebetween. An $N^+$ region 24 makes ohmic contact to the N type region 23. A similar diode 25 is formed within the die 20 and electrically connected in series with the diode 21. The exposed major surface of the die 20 is covered with a protective film 26 of silicon dioxide having a thickness on the order of .2 to 2 microns.

The active regions of the die 20 are electrically connected to each other and to the terminal pads 27 by means of evaporated aluminum interconnecting leads 28 which are deposited on the silicon dioxide insulating layer 26.

Each of the terminal pads 27 comprises an evaporated aluminum layer covered by an overlying electrolessly plated nickel layer. A solder globule 29 is disposed on each of the terminal pads 27. The outer surface of the mesa portion 4 of the die 20 containing active semiconductor elements is covered with a protective insulating layer 30 comprising silicon dioxide.

The mesas 12 shown in FIG. 3, and the single mesa shown in FIG. 4, may be formed by conventional etching techniques. The portions of the die not to be etched may be protected by means of a suitable photoresist. Due to the natural tendency of the etching solution to etch in a lateral as well as a normal direction, the edges of the central region 4 are tapered. This taper, or wedge geometry facilitates insertion of the die into the recess provided for it in the terminal lead array, and permits a wider tolerance in initial positioning of the die.

Rather than employing a raised portion comprising semiconductor material, the die may comprise a semiconductor substrate having active elements formed therein, onto which an insulating layer shaped to provide the desired relief pattern is deposited, laminated or otherwise formed.

Figure 5:
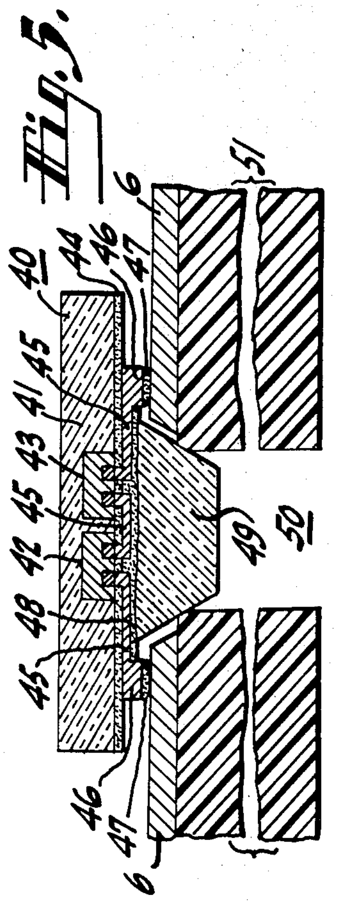
FIG. 5 shows a component-substrate assembly according to an alternative embodiment of the invention.

Such a structure is shown in FIG. 5, in which the die 40 comprises a semiconductor substrate 41 in which active elements such as diffused diodes 42 and 43 are formed.

The surface of the substrate 41 in which the active elements are disposed is covered with a protective insulating layer 44 comprising silicon dioxide, silicon nitride or any other suitable material.

Aluminum interconnecting leads 45 deposited on the insulating layer 44 electrically couple the operating regions of the active elements 42 and 43 to each other and to the terminal pads 46. The terminal pads 46 comprise an evaporated aluminum layer having an overlying layer comprising nickel electrolessly deposited thereon.

Solder globules 47 are disposed on each of the terminal pads 46. The exposed surface of the interconnecting leads 45 and of the semiconductor substrate 41 is protected by means of a silicon dioxide insulating layer 48. A glass layer 49 extends outwardly from the surface of the substrate 41, and has tapered edges formed in a relief pattern designed to interlock with a corresponding hole 50 formed in the substrate 51. In this case, the raised layer 49 interlocks with the edges of the hole 50 rather than with the ends of the terminal leads 6, as in the case of the embodiments shown in FIGS. 3 and 4.

The glass layer 49 should preferably be relatively thick in order to provide improved ease of indexing with the hole 50. However, difficulties increase in etching of precision patterns as the thickness of the insulating layer is increased. As a compromise, we have found that a thickness on the order of 1 to 10 mils for the raised layer 49 gives good results.

The layer 49 may comprise (i) a glass, such as a borosilicate or phosphosilicate, (ii) a nitride, such as silicon nitride, (iii) an organic polymeric compound, such as a plastic resin, or (iv) a laminated structure comprising a combination of two or more dielectric materials.

In particular, we have found that an insulating layer 49 comprising a base layer of phosphosilicate glass having a thickness on the order of 1 mil with an overlying relatively thin layer comprising borosilicate glass gives good results. Because the phosphosilicate glass (which is deposited from a mixture of $SiH_4$, $PH_3$ and $O_2$ at temperatures on the order of 450° C.) etches at a much higher rate than the overlying borosilicate layer, the borosilicate glass acts as an etch mask which improves the etch resolution. Good etch resolution can also be obtained by employing a photosensitive polymer such as that described in U.S. Pat. No. 3,081,168. Alternatively, a photosensitive polymer sold under the trade name of Templex by E. I. du Pont Company may be employed.

The raised layer 49 and interlocking or mating hole 50 may be of any desired noncircular cross-section to provide the desired registration between the terminal pads 46 and associated contact areas of the terminal leads 6 on the substrate 7.

Figure 6:
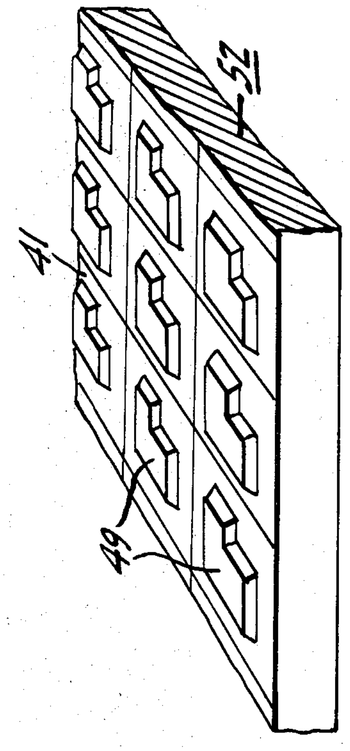
FIG. 6 shows an article of manufacture utilized in making the component shown in FIG. 5.

In order to realize reduced fabrication cost, it is desirable to deposit, laminate or otherwise form the layer 49 and etch the same to provide the desired raised areas, while the substrate 41 is part of a master semiconductor wafer. The resultant article 52, comprising a semiconductor wafer in which the desired active elements have been formed and on which the interconnecting leads and terminal pads have been deposited, is shown in FIG. 6. In order to provide the completed die, it is only necessary to sever each of the substrate areas 41 from the master wafer 52.

Rather than providing interlocking of the micro-minature component die with a terminal lead assembly by employing a raised pattern on the die, interlocking may be achieved by providing one or more raised portions on the terminal lead or substrate assembly, and a corresponding hole or holes in the die surface.

Figure 7:
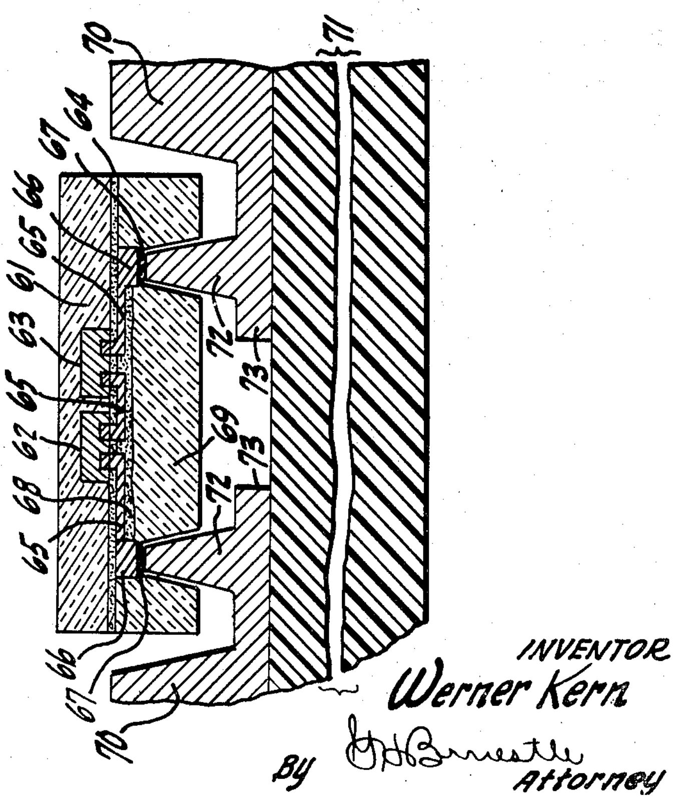
FIG. 7 shows a component-substrate assembly according to still another embodiment of the invention.

A structure in which this is done, and in which the interlocking members also serve as the electrical contacts, is shown in FIG. 7. The die 60 comprises a semiconductor substrate 61, similar to the substrate 41 shown in FIG. 5. The portions 62 through 68 perform functions similar to and are manufactured in similar fashion to the portions 42 through 48 of the substrate 41, respectively.

An insulating layer 69, which may comprise a material similar to that employed for the layer 49 shown in FIG. 5, is disposed on the major surface of the die 60 which contains the terminal pads 66. The insulating layer 69 has a number of tapered holes therein, each of which exposes at least a portion of a corresponding terminal pad 66.

A corresponding terminal lead assembly comprises a number of terminal leads 70 disposed on an insulating substrate 71. Each of the terminal leads 70, which may comprise, e.g., copper, has a generally conical tip 72 adjacent the end 73 thereof. Each of the generally conical tips 72 is disposed in a manner so that the tip may be brought into alignment with a corresponding terminal pad 66 of the die 60, registration between each terminal lead tip 70 and the corresponding die terminal pad 66 being assured by means of the tapered holes in the insulating layer 69.

Figure 8:
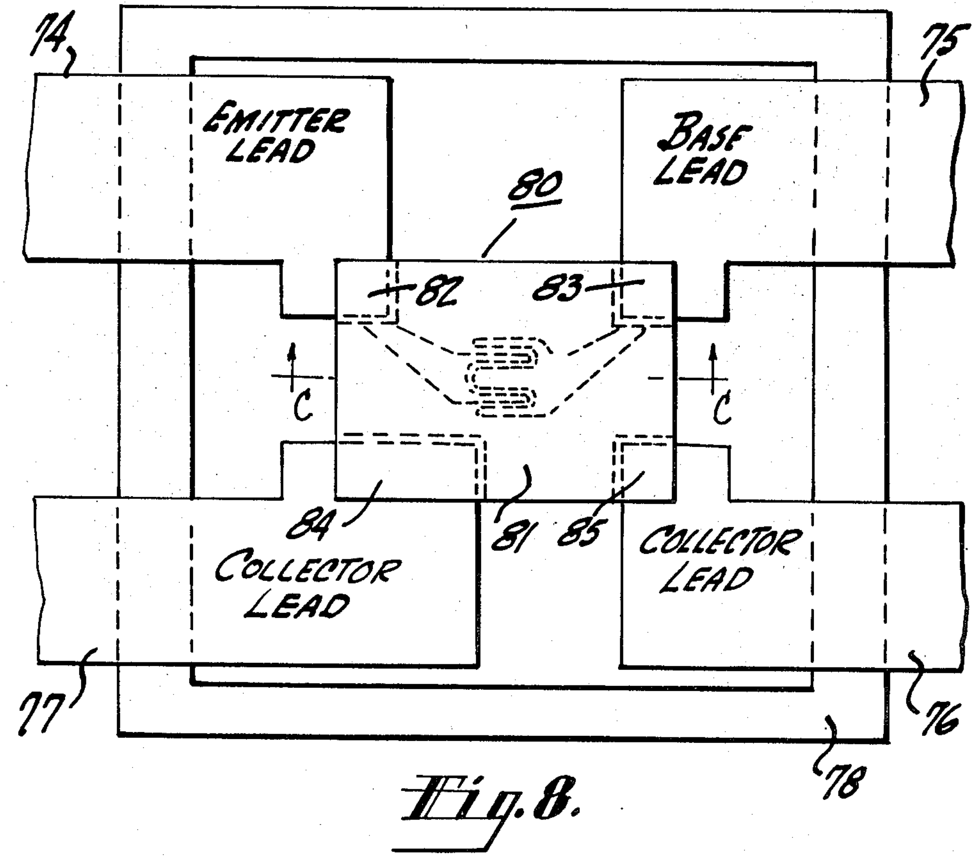
FIG. 8 shows a packaged semiconductor device according to the invention.

Rather than assembling the die to a terminal lead array on an insulating substrate, the die may be assembled to terminal leads which cantilever inwardly from a supporting lead frame, as shown in FIG. 8. In this assembly, the terminal leads 74 through 77 are supported by a ceramic insulating frame 78.

A die 80, comprising a semiconductor substrate having a transistor formed therein and a raised insulating layer 81 on the major surface of the die containing the terminal pads 82 through 85, is electrically connected to and supported by the end portions of terminal leads 74 through 77.

Proper alignment of the terminal pads 82 through 85 to the corresponding end portions of terminal leads 74 through 77 is insured by indexing of the raised insulating layer 81 with each of the terminal lead end portions.

The terminal leads 74 through 77 may comprise any suitable metal, it being only necessary that the end portions of these leads be solderable or otherwise bondable to the corresponding terminal pads 82 through 85 of the die 80; the coefficient of thermal expansion of the terminal leads of the material is preferably chosen so as not to put undue stress on the terminal pad to terminal lead bonds.

Figure 9:
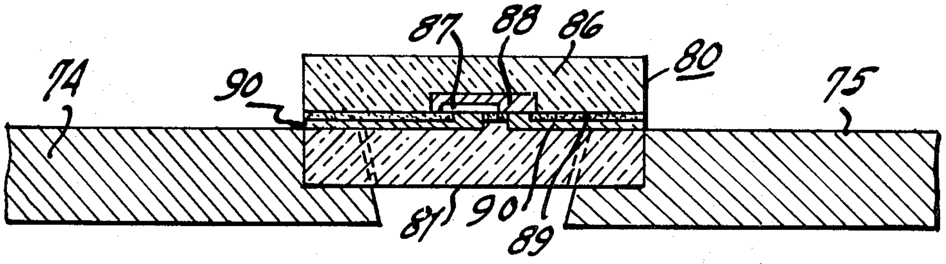
FIG. 9 shows a cross-sectional view of the device shown in FIG. 8 taken normal to the cutting plane C—C.

As seen in the cross-sectional view of FIG. 9, the die 80 includes a semiconductor substrate 86 which acts as the collector of the transistor formed therein. Diffused regions 87 and 88 act as the emitter and base of the transistor respectively. An insulating silicon dioxide layer 89 protects the exposed semiconductor surface adjacent the emitter and base regions and deposited aluminum leads 90 interconnect the emitter and base regions to the corresponding terminal leads 74 and 75.

What is claimed is:

1. A substrate having a major surface, a relief pattern formed in said major surface of said substrate, an electrical component comprising a semiconductor die having a relief pattern formed therein, said semiconductor die comprising an electrical element having a plurality of operating regions and a number of terminal pads connected to said operating regions, and at least a portion of the relief pattern of said die having a predetermined geometric alignment with said terminal pads, said semiconductor die being mounted on said substrate by said terminal pads such that the semiconductor die interlocks with the relief pattern formed in said major surface of said substrate.

2. An electrical component according to claim 1, wherein said pattern portion includes at least one protuberance.

3. An electrical component according to claim 2, wherein said protuberance is of generally noncircular cross-section.

4. An electrical component according to claim 3, wherein said protuberance is centrally disposed on said semiconductor die, and said pads are peripherally disposed thereon.

5. An electrical component according to claim 1, wherein said die comprises a body of semiconductor material having at least one mesa formed on said one major surface, said operating region being disposed within the mesa.

6. An electrical component according to claim 5, wherein the periphery of said mesa is generally noncircular and in predetermined geometric alignment with said terminal pads.

7. An electrical component according to claim 6, wherein said semiconductor body has a plurality of mesas formed thereon, the outer peripheries of said mesas defining said corresponding relief pattern.

8. An electrical component according to claim 1, wherein said die comprises a laminate of a semiconductor body and an insulating material, said operating region being disposed in the semiconductor body.

9. An electrical component according to claim 8, wherein said insulating material comprises a thin layer deposited on a given surface of said semiconductor body.

10. An electrical component according to claim 8, wherein said corresponding relief pattern is formed in said semiconductor body.

11. An electrical component according to claim 9, wherein said corresponding relief pattern is formed in said semiconductor body.

12. An electrical component according to claim 8, wherein said corresponding relief pattern is formed in said insulating material.

13. An electrical component according to claim 10, wherein said terminal pads are contiguous with said insulating material.

14. An electrical component according to claim 12, wherein said corresponding relief pattern comprises at least one hole in said insulating material.

15. An electrical component according to claim 14, wherein said insulating material overlies said semiconductor body, said material having a corersponding number of holes therein, each hole exposing at least a part of a corresponding terminal pad.

References Cited

UNITED STATES PATENTS

| | | | |
|---|---|---|---|
| 3,114,867 | 12/1963 | Szekely | 317—235 |
| 3,116,443 | 12/1963 | Forster et al. | 317—234 |
| 3,122,680 | 2/1964 | Benn et al. | 317—101 |
| 3,331,995 | 7/1967 | Larrison | 317—234 |
| 3,365,620 | 1/1968 | Butler et al. | 317—101 |
| 3,379,937 | 4/1968 | Shepherd | 317—101 |
| 3,192,307 | 6/1965 | Lazar | 317—235 X |
| 3,370,204 | 2/1968 | Cave | 317—101 |
| 3,388,301 | 6/1968 | James | 317—101 |
| 3,397,278 | 8/1968 | Pomerantz | 317—235 |
| 3,456,335 | 7/1969 | Hennings et al. | 317—101 |

JAMES D. KALLAM, Primary Examiner

A. J. JAMES, Assistant Examiner

U.S. Cl. X.R.

317—101, 234